(12) United States Patent
Kang et al.

(10) Patent No.: US 7,969,136 B2
(45) Date of Patent: Jun. 28, 2011

(54) BAND GAP CIRCUIT GENERATING A PLURALITY OF INTERNAL VOLTAGE REFERENCES

(75) Inventors: Khil-Ohk Kang, Kyoungki-do (KR); Sang-Jin Byeon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 734 days.

(21) Appl. No.: 11/987,936

(22) Filed: Dec. 6, 2007

(65) Prior Publication Data

US 2008/0303504 A1 Dec. 11, 2008

(30) Foreign Application Priority Data

Jun. 8, 2007 (KR) .................. 10-2007-0055936

(51) Int. Cl.
*G05F 3/30* (2006.01)
(52) U.S. Cl. ...................................................... 323/314
(58) Field of Classification Search .......... 323/313–317; 327/539
See application file for complete search history.

(56) References Cited

U.S. PATENT DOCUMENTS

| | | | | |
|---|---|---|---|---|
| 5,061,862 A | * | 10/1991 | Tamagawa | 327/541 |
| 5,751,142 A | * | 5/1998 | Dosho et al. | 323/316 |
| 6,130,829 A | | 10/2000 | Shin | |
| 6,297,671 B1 | * | 10/2001 | Shih et al. | 327/74 |
| 6,498,469 B2 | * | 12/2002 | Kobayashi | 323/313 |
| 6,504,783 B2 | | 1/2003 | Jo | |
| 6,535,447 B2 | | 3/2003 | Kim et al. | |
| 6,677,808 B1 | * | 1/2004 | Sean et al. | 327/539 |
| 6,980,448 B2 | | 12/2005 | Foss et al. | |
| 7,016,248 B2 | | 3/2006 | Park et al. | |
| 7,482,857 B2 | * | 1/2009 | Song | 327/538 |

FOREIGN PATENT DOCUMENTS

| | | |
|---|---|---|
| JP | 2002-170387 | 6/2002 |
| JP | 2006-093692 | 4/2006 |
| KR | 1019960011205 B1 | 8/1996 |
| KR | 1020040093862 A | 11/2004 |

OTHER PUBLICATIONS

Notice of Allowance issued from Korean Intellectual property Office on Sep. 5, 2008 with an English translation.

* cited by examiner

*Primary Examiner* — Harry Behm
(74) *Attorney, Agent, or Firm* — IP & T Group LLP

(57) ABSTRACT

A semiconductor device includes: a first reference voltage generator for generating a first reference voltage; a first band gap circuit for dividing a voltage at a second reference voltage output node to produce a first and a second band gap voltages having a property relative to temperature variations; a first comparator for receiving the first reference voltage as a bias input and comparing the first band gap voltage with the second band gap voltage; and a first driver for pull-up driving the second reference voltage output node in response to an output signal of the first comparator.

14 Claims, 7 Drawing Sheets

BAND GAP CIRCUIT GENERATING A PLURALITY OF INTERNAL VOLTAGE REFERENCES

CROSS-REFERENCE TO RELATED APPLICATIONS

This application invention claims priority of Korean patent application number 10-2007-0055936, filed on Jun. 8, 2007, which is incorporated by reference in its entirety.

BACKGROUND OF THE INVENTION

The subject matter relates to a semiconductor design technology, and particularly, to a reference voltage generation circuit for a semiconductor device, which is capable of generating a reference voltage maintaining a stable target voltage level even when a bias voltage becomes unstable due to variations of a power supply voltage supplied from outside.

In most electronic circuit systems, generally, a power supply voltage supplied thereto is not constantly maintained, but varies with the passage of time and due to their ambient temperatures, any difference between processes, and generation of heat in electronic systems and semiconductor chips, that is, variations of Process, Voltage, and Temperature (PVT).

These variations cause several unfavorable variations in operating characteristics of semiconductor chips. Thus, it is necessary that circuits in the semiconductor chips can operate regardless of theses variations in most precise semiconductor chips.

One of effective methods that deal with these variations is that a reference voltage generator that supplies a voltage or current to other circuits is provided such that it always generate a constant voltage regardless of the variations.

SUMMARY OF THE INVENTION

Embodiments of the present invention are directed to providing a semiconductor device capable of generating a reference voltage maintaining a stable target voltage level even when a bias voltage becomes unstable due to variations of a power supply voltage supplied from outside.

Embodiments of the present invention are directed to providing a semiconductor device capable of generating a stable reference voltage maintaining a preset target voltage level even when a voltage level of a power supply voltage from outside relatively sharply increases by process, voltage and temperature (PVT) variations.

In accordance with a first aspect of the present invention, there is provided a semiconductor device, including: a first reference voltage generator for generating a first reference voltage; a first band gap circuit for dividing a voltage at a second reference voltage output node to produce a first and a second band gap voltages having a property relative to temperature variations; a first comparator for receiving the first reference voltage as a bias input and comparing the first band gap voltage with the second band gap voltage; and a first driver for pull-up driving the second reference voltage output node in response to an output signal of the first comparator.

In accordance with a second aspect of the present invention, there is provided a method for driving a semiconductor device, including: generating a first reference voltage; dividing a voltage at a second reference voltage output node to produce a first band gap voltage having a negative property and a second band gap voltage having a positive property relative to temperature variations to output the voltage at the second reference voltage output node as a second reference voltage; receiving the first reference voltage as a bias input and comparing the first band gap voltage with the second band gap voltage to output a first comparison voltage; and pull-up driving the second reference voltage output node in response to the first comparison voltage.

In accordance with a third aspect of the present invention, there is provided a semiconductor device, including: a first reference voltage generator for generating a first reference voltage; a second reference voltage generator which has a band gap circuit operating using the first reference voltage as a bias input to generate a second reference voltage; and an internal reference voltage generator for generating a plurality of internal reference voltages having preset different voltage levels corresponding to a level of the second reference voltage.

DESCRIPTION OF SPECIFIC EMBODIMENTS

Hereinafter, preferred embodiments of the present invention will be set forth in detail with reference to the accompanying drawings so that those skilled in the art can easily carry out the invention. The present invention is not limited to the embodiments set forth below but may be implemented in various types, and these embodiments are provided only for full disclosure of the invention and for those skilled in the art to completely know the scope of the invention.

Figure 1:
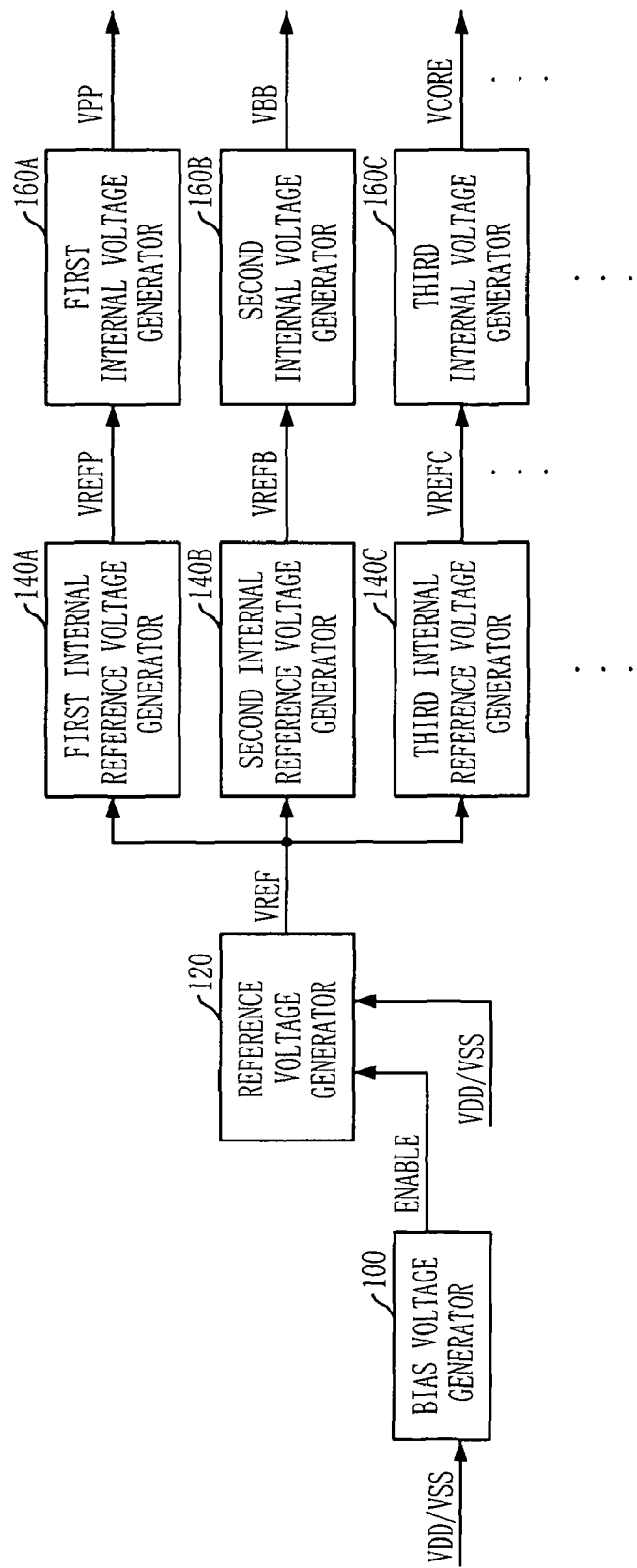
FIG. 1 is a block diagram showing an internal voltage generation circuit for a semiconductor device.

FIG. 1 is a block diagram showing an internal voltage generation circuit for a semiconductor device.

Referring to FIG. 1, the internal voltage generation circuit for the semiconductor device includes a bias voltage generator 100, a reference voltage generator 120, a plurality of internal reference voltage generators 140A, 140B, and 140C, and a plurality of internal voltage generators 160A, 160B, and 160C.

The bias voltage generator 100 generates a bias voltage ENABLE in response to a power supply voltage VDD and a ground voltage VSS supplied from outside. The reference voltage generator 120 generates a reference voltage VREF using the bias voltage ENABLE as a bias input. The plurality of internal reference voltage generators 140A, 140B, and 140C generate a plurality of internal reference voltages VREFP, VREFB, and VREFC with preset different voltage levels in response to the reference voltage VREF. The plurality of internal voltage generators 160A, 160B, and 160C generate a plurality of internal voltages VPP, VBB, and VCORE based on the plurality of internal reference voltages VREFP, VREFB, and VREFC.

Figure 2:
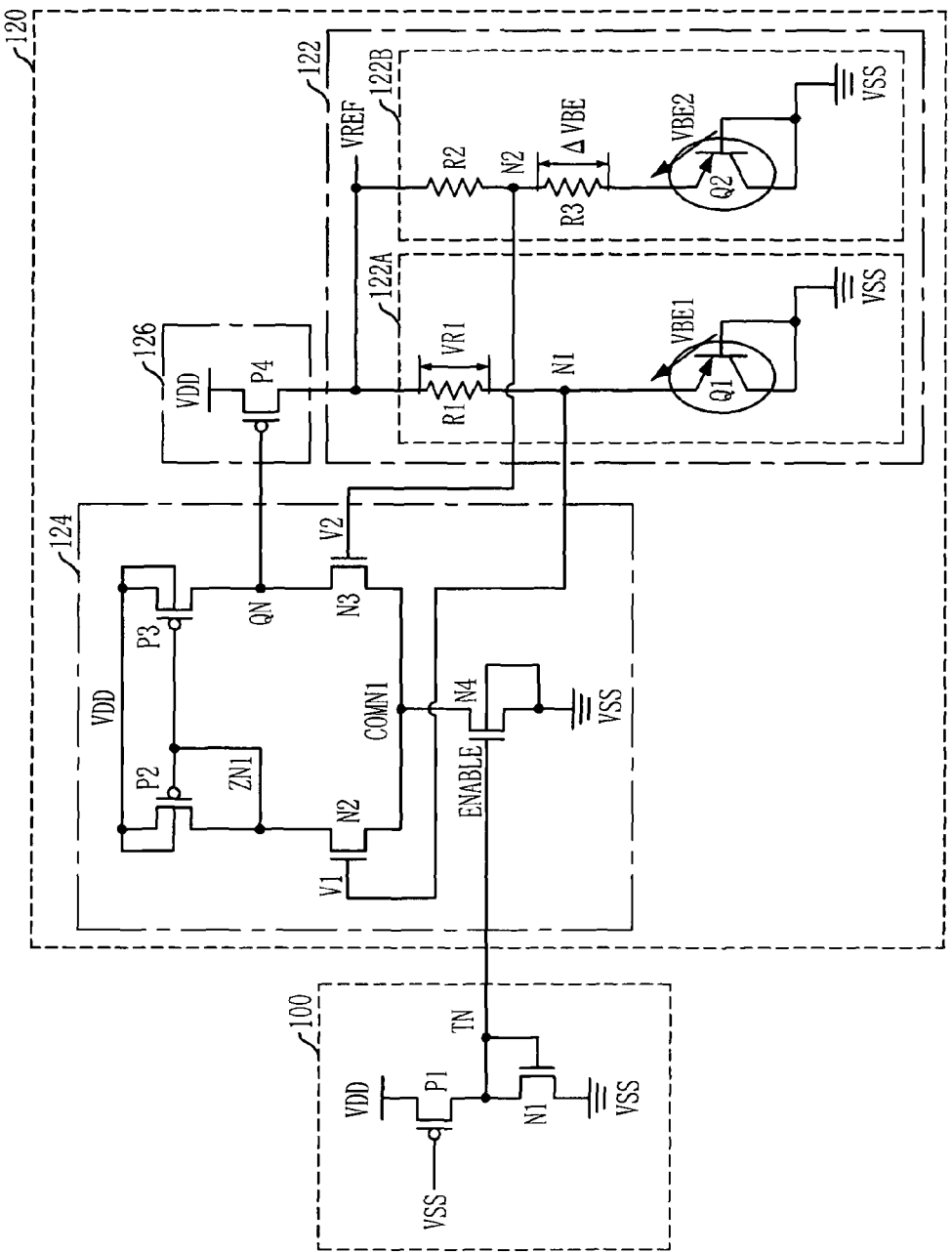
FIG. 2 is a detailed circuit diagram of a bias voltage generator and a reference voltage generator among components of the internal voltage generation circuit for the semiconductor device shown in FIG. 1.

FIG. 2 is a detailed circuit diagram of the bias voltage generator and the reference voltage generator among components of the internal voltage generation circuit for the semiconductor device shown in FIG. 1.

Referring to FIG. 2, among the components of the internal voltage generation circuit for the semiconductor device shown in FIG. 1, the bias voltage generator 100 is provided with a first PMOS transistor P1 and a first NMOS transistor N1 coupled in series between a power supply voltage (VDD) terminal and a ground voltage (VSS) terminal and generates the bias voltage ENABLE at a connection node TN of the first PMOS transistor P1 and the first NMOS transistor N1. The first PMOS transistor P1, in response to the ground voltage VSS applied via its gate, controls the connection of the power supply voltage (VDD) terminal and the connection node TN which are coupled to its drain and source. The first NMOS transistor N1 operates as a diode between the ground voltage (VSS) terminal connected to its source and the connection node TN connected to its gate and drain.

The following is an operation description for the bias voltage generator 100 having this configuration. The first PMOS transistor P1 and the first NMOS transistor N1 capable of operating as resistor elements are always turned on when the power supply voltage VDD is applied from the outside, and therefore, a target voltage level of the bias voltage ENABLE applied to the connection node TN of the first PMOS transistor P1 and the first NMOS transistor N1 is determined by their size ratios set at the time of design.

Further, among the components of the internal voltage generation circuit for the semiconductor device shown in FIG. 1, the reference voltage generator 120 is provided with a band gap circuit 122, a comparator 124, and a driver 126.

The band gap circuit 122 divides a voltage at a reference voltage (VREF) output terminal to produce a first band gap voltage V1 having a negative property and a second band gap voltage V2 having a positive property relative to temperature variations. The comparator 124 compares the first band gap voltage V1 with the second band gap voltage V2 to output a drive control signal DRV. The driver 126 drives the voltage at the reference voltage (VREF) output terminal in response to the drive control signal DRV outputted from the comparator 124.

To be more specific, the band gap circuit 122 is composed of a first band gap voltage generator 122A for dividing a voltage at the reference voltage (VREF) output terminal to produce the first band gap voltage V1 whose level, has a negative property relative to temperature variations, and a second band gap voltage generator 122B for dividing the voltage at the reference voltage (VREF) output terminal to produce the second band gap voltage V2 whose level has a positive property relative to temperature variations, negative property increases positive property.

Further, the first band gap voltage generator 122A is composed of a first resistor R1 having a fixed resistance value, and a first bipolar junction transistor Q1 whose resistance value varies while having a has negative property relative to temperature variations, wherein the first resistor R1 and the first bipolar junction transistor Q1 are coupled in series between the reference voltage (VREF) output terminal and a ground voltage (VSS) terminal and the first band gap voltage V1 is outputted at a connection node N1 of the first resistor R1 and the first bipolar junction transistor Q1.

The second band gap voltage generator 122B is composed of a second resistor R2 and a third resistor R3 having fixed resistance values, and a second bipolar junction transistor Q2 whose resistance value varies while having a negative property relative to temperature variations, and having an emitter size which is X times as large as that of the first bipolar junction transistor Q1, wherein the second resistor R2, the third resistor R3, and the second bipolar junction transistor Q2 are coupled in series between the reference voltage (VREF) output terminal and the ground voltage (VSS) terminal and the second band gap voltage V2 is outputted at a connection node N2 of the second resistor R2 and the third resistor R3.

The comparator 124 is composed of a second NMOS transistor N2 for controlling a connection of a driving node ZN1 and a common node COMN1 coupled to its drain and source, respectively, in response to the first band gap voltage V1 applied via its gate, a third NMOS transistor N3 for controlling a connection of an output node QN1 and the common node COMN1 coupled to its drain and source, respectively, in response to the second band gap voltage V2 applied via its gate, second and third PMOS transistors P2 and P3, connected in a current mirror type between the power supply voltage (VDD) terminal, the driving node ZN1 and the output node QN1, for controlling an amount of current flowing in the driving node ZN1 to be equal to that flowing in the output node QN1, and a fourth NMOS transistor N4 for controlling a connection of the common node COMN1 and the ground voltage (VSS) terminal coupled to its drain and source, respectively, in response to the bias voltage ENABLE applied via its gate.

Further, the driver 126 is provided with a fourth PMOS transistor P4 for controlling a connection of the power supply voltage (VDD) terminal and the reference voltage (VREF) output terminal coupled to its drain and source, respectively, in response to the drive control signal DRV applied from the comparator 124 to its gate.

Now, the operation of the reference voltage generator 120 for the semiconductor device based on the aforementioned configuration will be described below in detail.

First, among the components of the band gap circuit 122, the resistance values of the first bipolar junction transistor Q1 provided in the first band gap voltage generator 122A and the second bipolar junction transistor Q2 provided in the second band gap voltage generator 122B have a negative property relative to temperature variations as mentioned above.

By the way, the first bipolar junction transistor Q1 and the second bipolar junction transistor Q2 which are forward-biased are designed such that an area ratio of the emitter ends is 1:X, and, due to this area difference of the emitter ends, a current density flowing through the first bipolar junction transistor Q1 becomes different from that flowing through the second bipolar junction transistor Q2. Thus, the magnitude of a first base-emitter voltage VBE1 formed between the base and emitter ends of the first bipolar junction transistor Q1 becomes different from that of a second base-emitter voltage VBE2 formed between the base and emitter ends of the second bipolar junction transistor Q2.

In other words, a delta base-emitter voltage ΔVBE which represents the difference between the first base-emitter voltage VBE1 and the second base-emitter voltage VBE2 can be defined as:

$$\Delta V_{BE} = (V_{BE1} - V_{BE2}) = \left(\frac{kT}{q}\right) \times \ln(X) \qquad \text{Eq. (1)}$$

wherein, in Eq. (1), k denotes a Boltzman constant, T represents an absolute temperature, q denotes a charge quantity and X represents a cross-sectional area of the emitter end.

As can be seen from Eq. (1), the delta base-emitter voltage ΔVBE is proportional to the absolute temperature T. That is, the delta base-emitter voltage ΔVBE has a positive property relative to temperature variations. Thus, the first band gap voltage V1 that has the same value as the first base-emitter voltage VBE1 has a negative property relative to temperature variations and the second band gap voltage V2 having the same as the delta base-emitter voltage ΔVBE has a negative property relative to temperature variations.

The first band gap voltage V1 and the second band gap voltage V2 are applied to the comparator 124. This affects the determination of a voltage level of the drive control signal DRV, thereby determining the voltage level of the reference voltage (VREF) output terminal by controlling the operation of the driver 126.

Concretely explaining the operation of the comparator 124 and the driver 126, when the voltage level of the first band gap voltage V1 decreases due to an increase in temperature, the amount of current flowing into the driving node ZN1 corresponding to the first band gap voltage V1 decreases and thus the voltage level of the driving node ZN1 starts to decrease. The amount of current flowing into the output node QN1 just decreases by current mirroring at the same time. That is, the voltage level of the output node QN1 just starts to decrease. At this time, as mentioned above, the voltage level of the second band gap voltage V2 increases relative to the increase in temperature, and thus, the decrease in the amount of current flowing into the output node QN1 by current mirroring is compensated, thereby preventing the amount of current flowing into the output node QN1 from varying. Also, the voltage level of the output node QN1, i.e., the voltage level of the drive control signal DRV does not vary.

Accordingly, the driving power of the driver 126 is not varied, so that the voltage level of the reference voltage (VREF) output terminal is not varied.

Further, the voltage level applied to the reference voltage (VREF) output terminal can be represented in an equation using the first band gap voltage V1 and the second band gap voltage V2. As described above, the first band gap voltage V1 has the same value as the first base-emitter voltage VBE1 and their voltage levels have a negative property relative to temperature variations. Likewise, the second band gap voltage V2 and the delta base-emitter voltage ΔVBE have the same meaning and their voltage levels have a positive property relative to temperature variations.

First, the delta base-emitter voltage ΔVBE has the same value as the first resistor voltage VR1 across the first resistor R1, and thus, the first current I1 flowing through the first resistor R1 can be defined as follows:

$$I_1 = \left(\frac{V_{R1}}{R_1}\right) = \left(\frac{\Delta V_{BE}}{R_1}\right) = \left(\frac{kT}{q}\right) \times \left(\frac{\ln(X)}{R_1}\right) \qquad \text{Eq. (2)}$$

Therefore, the reference voltage VREF can be defined as:

$$\begin{aligned} VREF &= V2 + R2 \times I1 \\ &= VBE1 + R2 \times \left(\frac{VVBE}{R1}\right) \\ &= VBE1 + \left(\frac{R2}{R1}\right) \times \left(\frac{kT}{q}\right) \times \ln(X) \end{aligned} \qquad \text{Eq. (3)}$$

From Eq. (3), it can be seen that the reference voltage VREF is proportional to the first base-emitter voltage VBE1 formed at the base-emitter of the first bipolar junction transistor Q1 and thus is proportional to a ratio of the second resistor to the first resistor, i.e., R2/R1, and the delta base-emitter voltage ΔVBE.

That is, the reference voltage generator 120 can generate the reference voltage VREF maintaining a stable level regardless of temperature variations by using the first band gap voltage V1 having a negative property relative to temperature variations and the second band gap voltage V2 having a positive property relative to temperature variations.

If the reference voltage VREF generated by the above-mentioned principle is ideal, the predetermined target voltage level should be always maintained regardless of PVT variations. However, in case the voltage level of the power supply voltage VDD supplied from the outside is relatively largely increased due to PVT variations and thus the voltage level of the bias voltage ENABLE is relatively largely increased, the reference voltage (VREF) output terminal does not maintain the predetermined target voltage level by the reasons as follows.

First, if the voltage level of the bias voltage ENALE increases relatively small, the voltage level of the common node COMN in the comparator 124 starts to decrease relative to an increased voltage level variation width of the bias voltage ENABLE. At this time, the comparator 124 normally operates and thus the reference voltage (VREF) output terminal maintains the predetermined target voltage level.

After that, if the voltage level of the bias voltage ENALE increases relatively largely, the fourth NMOS transistor N4 in the comparator 124 does not satisfy conditions required to operate as a current source, for example, the condition like Eq. (4) below, and thus fails to operate as the current source.

$$V_{GS} - V_{TH} \leq V_{DS} \qquad \text{Eq. (4)}$$

That is, the fourth NMOS transistor N4 does not maintain the saturation state due to a large increase in the voltage level of the bias voltage ENABLE applied to the gate of the fourth NMOS transistor N4, but becomes in a linear state, which makes the current flowing between the drain-source thereof unstably vary and in turn does not operate as the current source.

Like this, if the fourth NMOS transistor N4 in the comparator 124 does not operate as the current source, an offset voltage occurs at the gate ends of the second and the third NMOS transistors N2 and N3 to which the first band gap voltage V1 and the second band gap voltage V2 are applied.

Thus, the voltage level of the first band gap voltage V1 or the second band gap voltage V2 generated by the band gap circuit 122 is additionally increased by the offset voltage of the comparator 124, so that the voltage level of the reference voltage (VREF) output terminal does not maintain the predetermined target voltage level.

Figure 3:
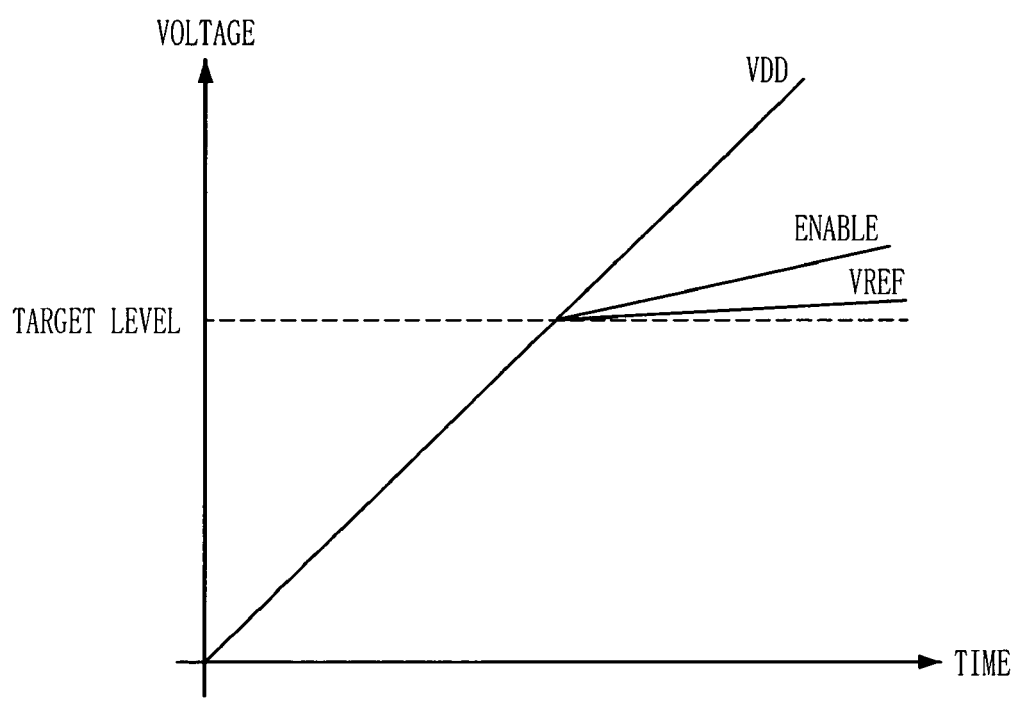
FIG. 3 is a graph showing voltage level variations of a bias voltage and a reference voltage generated by the bias voltage generator and the reference voltage generator depicted in FIG. 2 according to voltage level variations of a power supply voltage from the outside.

FIG. 3 is a graph showing voltage level variations of the bias voltage and the reference voltage generated by the bias voltage generator and the reference voltage generator depicted in FIG. 2 according to voltage level variations of the power supply voltage from the outside.

Referring to FIG. 3, it can be seen that the voltage level of the bias voltage ENABLE generated by the bias voltage generator 100 increases relative to an increase in the voltage level of the power supply voltage VDD from the outside and the voltage level of the reference voltage VREF outputted from the reference voltage generator 120 increases relative to an increase in the voltage level of the bias voltage ENABLE.

As described above, if the voltage level of the reference voltage VREF varies with the level variation of the power supply voltage VDD from the outside, the levels of a plurality of internal voltages VPP, VBB, VCORE, . . . , generated based on the voltage level of the reference voltage VREF vary in a greater voltage level variation than that of the reference voltage VREF.

Further, since it is expected that the semiconductor memory devices produced in the future will gradually pursue a higher speed operation, they may malfunction due to level variations of the reference voltage VREF that varies relative to level variations of the power supply voltage VDD from the outside.

Figure 4:
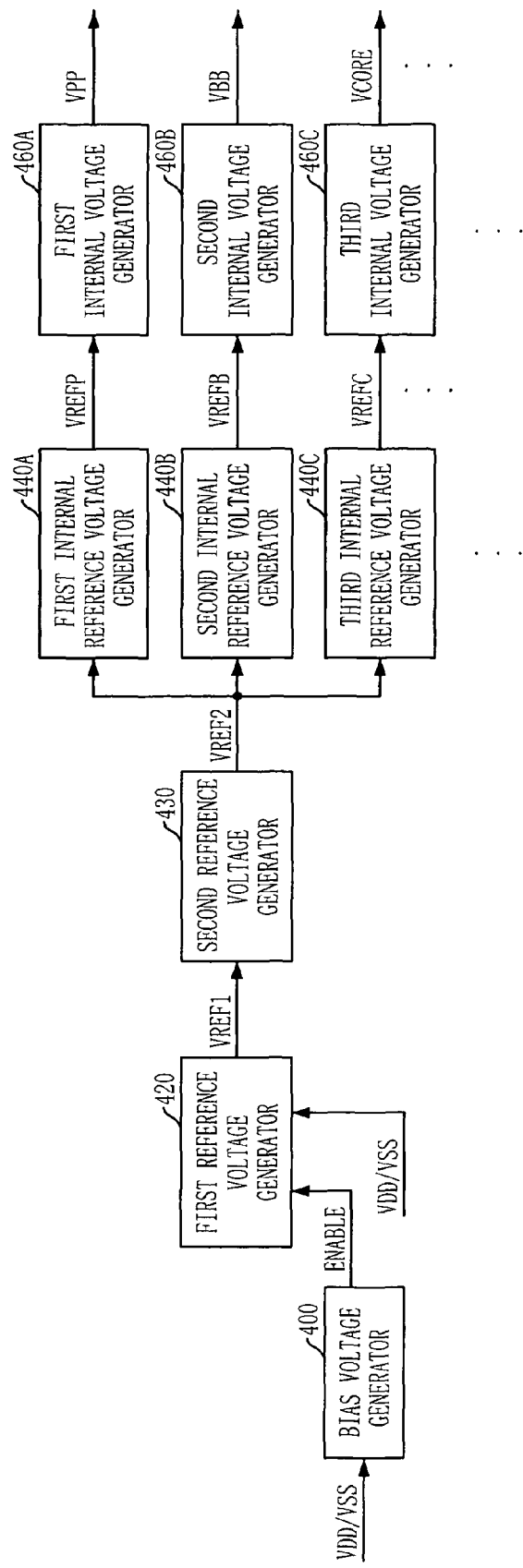
FIG. 4 is a block diagram illustrating an internal voltage generation circuit for a semiconductor device in accordance with one embodiment of the present invention.

FIG. 4 is a block diagram showing an internal voltage generation circuit for a semiconductor device in accordance with one embodiment of the present invention.

Referring to FIG. 4, the inventive internal voltage generation circuit includes a bias voltage generator 400, a first reference voltage generator 420, a second reference voltage generator 430, a plurality of internal reference voltage generators 440A, 440B, and 440C, and a plurality of internal voltage generators 460A, 460B, and 460C.

The bias voltage generator 400 generates a bias voltage ENABLE in response to a power supply voltage VDD and a ground voltage VSS supplied from the outside. The first reference voltage generator 420 produces a first reference voltage VREF1 using the bias voltage ENABLE as a bias input. The second reference voltage generator 430 generates a second reference voltage VREF2 using the first reference voltage VREF1 as a bias input. The plurality of internal reference voltage generators 440A, 440B, and 440C generate a plurality of internal reference voltages VREFP, VREFB, and VREFC with preset different voltage levels in response to the second reference voltage VREF2. The plurality of internal voltage generators 460A, 460B, and 460C generate a plurality of internal voltages VPP, VBB, and VCORE based on the plurality of internal reference voltages VREFP, VREFB, and VREFC.

Figure 5:
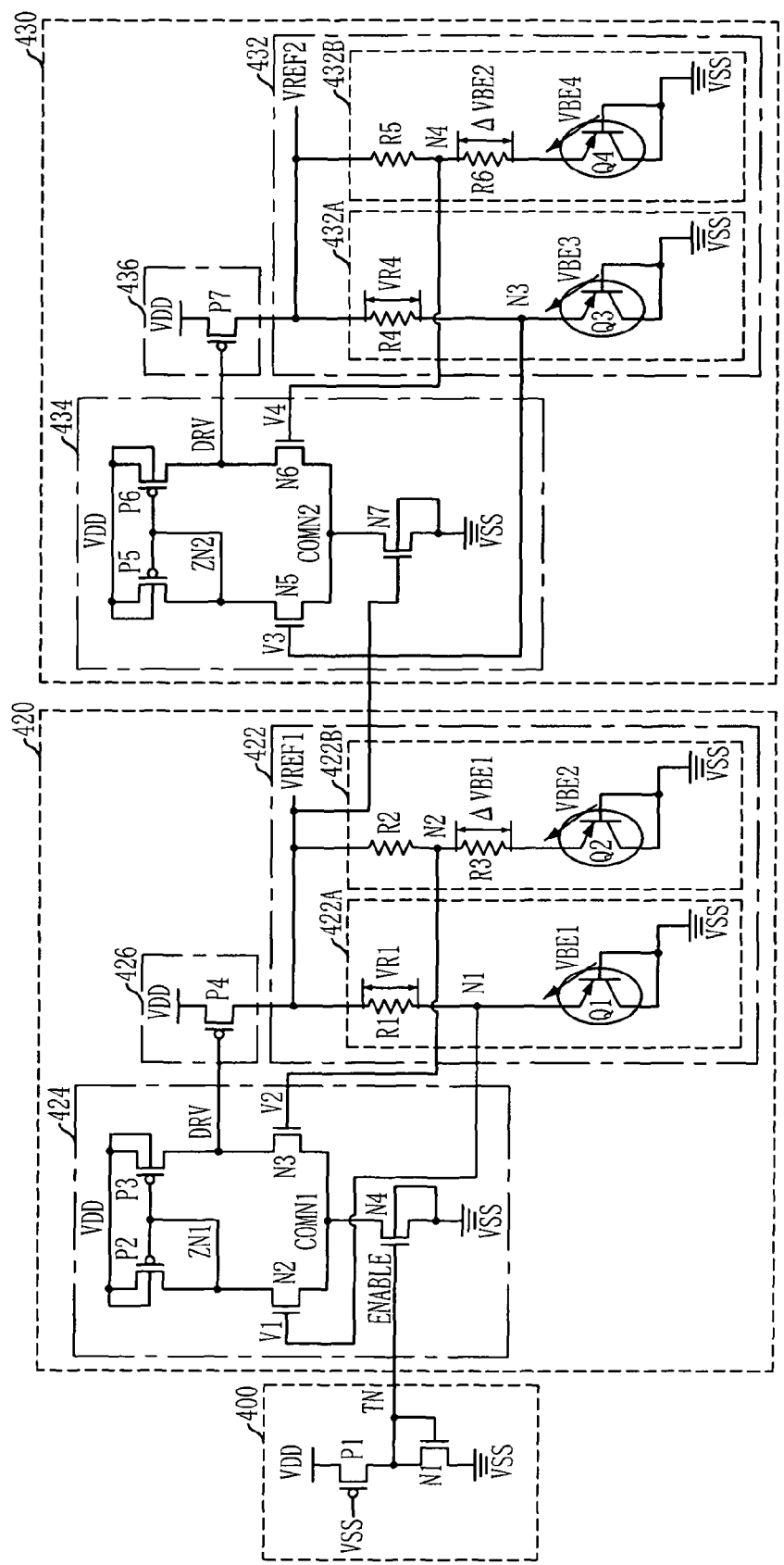
FIG. 5 is a detailed circuit diagram of a bias voltage generator, and first and the second reference voltage generators employing a band gap circuit among components of the inventive internal voltage generation circuit shown in FIG. 4 in accordance with a first embodiment of the present invention.

FIG. 5 is a detailed circuit diagram of the bias voltage generator, and the first and the second reference voltage generators employing a band gap circuit among the components of the inventive internal voltage generation circuit shown in FIG. 4 in accordance with a first embodiment of the present invention.

Referring to FIG. 5, it can be seen that the bias voltage generator 400, and the first and the second reference voltage generators 420 and 430 among the components of the inventive internal voltage generation circuit have similar configurations to the bias voltage generator 100 and the reference voltage generator 120 mentioned above in conjunction with FIG. 2.

First, since the bias voltage generator 400 of the present invention shown in FIG. 5 is substantially the same as the existing bias voltage generator 100 shown in FIG. 2 in configuration and operation, the configuration and operation thereof will be referred to the existing bias voltage generator 100 shown in FIG. 2.

Further, since the first reference voltage generator 420 of the present invention shown in FIG. 5 is also substantially the same as the existing reference voltage generator 120 shown in FIG. 2 in configuration and operation, the configuration and operation thereof will be referred to the existing bias voltage generator 100 shown in FIG. 2.

Meanwhile, the second reference voltage generator 430 of the present invention shown in FIG. 5 seems to be substantially the same as the existing reference voltage generator 120 shown in FIG. 2 in configuration, but it can be seen that there exists a difference therebetween in configuration, as set forth below.

More specifically, the second reference voltage generator 430 of the present invention shown in FIG. 5 is configured to have a band gap circuit 432 for dividing a voltage at a second reference voltage (VREF2) output terminal to produce a third band gap voltage V3 having a negative property and a fourth band gap voltage V4 having a positive property relative to temperature variations, a comparator 434 for receiving a first reference voltage VREF1 as a bias input and comparing the third band gap voltage V3 with the fourth band gap voltage V4, and a driver 436 for pull-up driving the second reference voltage (VREF2) output terminal in response to an output signal of the comparator 434.

The band gap circuit 432 is substantially the same as the existing band gap circuit 122 of the reference voltage generator 120 shown in FIG. 2 in configuration and operation, and therefore, the configuration and operation thereof will be referred to the existing band gap circuit 122 of the reference voltage generator 120 shown in FIG. 2.

Similarly, the driver 436 is substantially the same as the existing driver 126 of the reference voltage generator 120 shown in FIG. 2 in configuration and operation, and therefore, the configuration and operation thereof will be referred to the existing driver 126 of the reference voltage generator 120 shown in FIG. 2.

However, the comparator 434 of the second reference voltage generator 430 in accordance with the embodiment of the present invention uses the first reference voltage VREF1 generated by the first reference voltage generator 420 as a bias input, whereas the driver 126 of the general reference voltage generator 120 shown in FIG. 2 uses the bias voltage ENABLE generated by the bias voltage generator 400 as a bias input.

As discussed above, by implementing in such a way that the comparator 434 of the second reference voltage generator 430 in accordance with the first embodiment of the present invention uses the first reference voltage VREF1 instead of the bias voltage ENABLE as a bias input, the voltage level of the second reference voltage (VREF2) output terminal can maintain a stable target voltage level regardless of an increase of the power supply voltage VDD from the outside based on the following technical principle.

First, the operations of the bias voltage generator 400 and the first reference voltage generator 420 of the present invention shown in FIG. 5 are substantially the same as those of the existing bias voltage generator 100 and the reference voltage generator 120 in FIG. 2, as set forth above. Therefore, the bias voltage generator 400 of the present invention shown in FIG.

5 generates the bias voltage ENABLE with an increased voltage level corresponding to an increase in the voltage level of the power supply voltage VDD from the outside and thus the first reference voltage generator 420 generates an offset voltage to increase a level of the first reference voltage VREF1.

By the way, the bias voltage ENABLE generated by the bias voltage generator 400 is a voltage generated by dividing the power supply voltage VDD from the outside at a preset ratio, and thus has a relatively smaller increased voltage level variation width than that of the power supply voltage VDD by PVT variations.

The voltage level of the first reference voltage VREF1 generated by the first reference voltage generator 420 increases by the offset voltage generated at the input end as the voltage level of the bias voltage ENABLE increases more than a preset level. Therefore, the increased voltage level variation width of the first reference voltage VREF1 by PVT variations has a relatively very small increased voltage level variation width as compared to that of the bias voltage ENABLE, by considering the fact that the voltage level of offset voltage is relatively very small as compared to a target voltage level of the first reference voltage VREF1.

Figure 6:
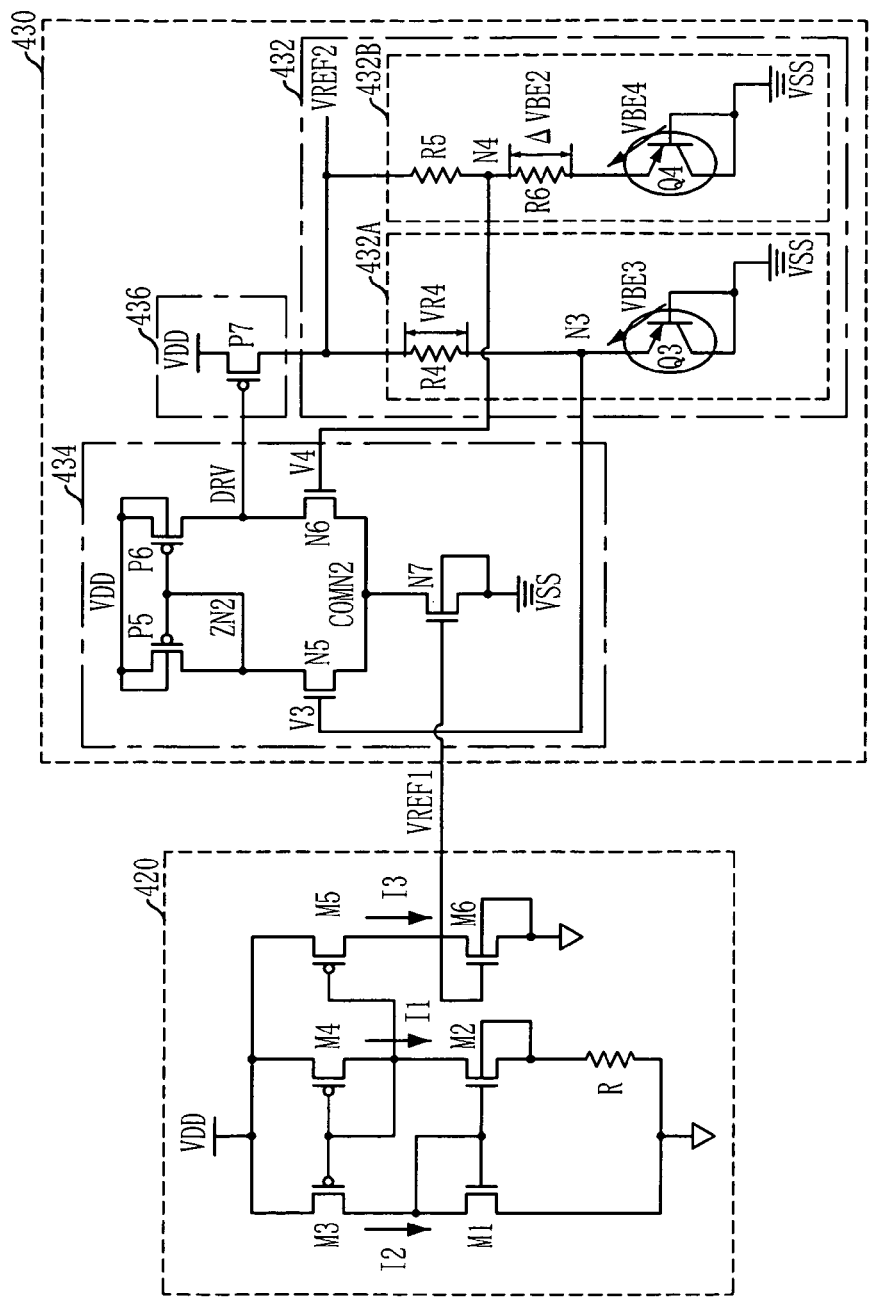
FIG. 6 is a detailed circuit diagram of a first reference voltage generator employing a Widlar circuit and a second reference voltage generator applying a band gap circuit among the components of the inventive internal voltage generation circuit shown in FIG. 4 in accordance with a second embodiment of the present invention.

FIG. 6 is a detailed circuit diagram of the first reference voltage generator employing a Widlar circuit and the second reference voltage generator employing a band gap circuit among the components of the inventive internal voltage generation circuit shown in FIG. 4 in accordance with a second embodiment of the present invention.

Referring to FIG. 6, it can be seen that the first reference voltage generator 420 employing the Widlar circuit among the components of the inventive internal voltage generation circuit shown in FIG. 4 does not need to receive the bias voltage ENABLE, unlike the first reference voltage generator 420 employing the band gap circuit shown in FIG. 5.

Thus, in case the first reference voltage generator 420 employing the Widlar circuit is used, the bias voltage generator 400 among the components of the inventive internal voltage generation circuit shown in FIG. 4 is not needed.

Further, the first reference voltage VREF1 generated by the first reference voltage generator 420 employing the Widlar circuit has almost same characteristic as the first reference voltage VREF1 generated by the first reference voltage generator 420.

That is, the voltage level of the first voltage VREF1 can be defined as:

$$V_{GS1} = V_{TH} + \sqrt{\frac{2 \times I1}{\mu nCox \times \left(\frac{W1}{L1}\right)}}, \quad \text{Eq. (5)}$$

$$V_{GS2} = V_{TH} + \sqrt{\frac{2 \times I2}{\mu nCox \times \left(\frac{W2}{L2}\right)}}$$

$$V_{GS2} = V_{GS1} + I1 \times R$$

$$\text{Thus, } V_{TH} + \sqrt{\frac{2 \times I1}{\mu nCox \times \left(\frac{W1}{L1}\right)}} + I1 \times R =$$

$$V_{TH} + \sqrt{\frac{2 \times I2}{\mu nCox \times \left(\frac{W2}{L2}\right)}}$$

-continued
Further, $I1 = I2$ by current mirroring by $M3$ and $M4$ $$\text{Therefore, } I1 = I2 = \frac{2}{R^2 \mu nCox} \left( \frac{1}{\sqrt{\left(\frac{W2}{L2}\right)}} - \frac{1}{\sqrt{\left(\frac{W1}{L1}\right)}} \right)^2$$

And, $VREF1 = V_{GS6}$, $I1 = I3$

Thus, $$VREF1 = V_{TH} + \frac{2}{R\mu nCox \times \left(\frac{W6}{L6}\right)} \left( \frac{1}{\sqrt{\left(\frac{W2}{L2}\right)}} - \frac{1}{\sqrt{\left(\frac{W1}{L1}\right)}} \right)^2$$

In other words, it can be seen that the first reference voltage VREF1 is independent of the power supply voltage VDD from the outside. However, the first reference voltage VREF1 resulting from Eq. (5) is an ideal case and actually its voltage level is affected by the voltage level of the power supply voltage VDD due to channel length modulation occurring among internal MOS transistors M1, M2, M3, M4, M5, and M6.

Thus, when the voltage level of the power supply voltage VDD from the outside increases, the voltage level of the first reference voltage VREF1 generated by the first reference voltage generator 420 employing the Widlar circuit also increases, like the first reference voltage VREF1 generated by the first reference voltage generator 420 applying the band gap circuit shown in FIG. 5.

Needless to say, the increased voltage level variation width of the first reference voltage VREF1 generated by the first reference voltage generator 420 employing the Widlar circuit is relatively very small as compared to the increased voltage level variation width of the power supply voltage VDD from the outside, like the first reference voltage VREF1 generated by the first reference voltage generator 420 applying the band gap circuit shown in FIG. 5.

Like this, if the first reference voltage VREF1 with a relatively very smaller increased voltage level variation width than that of the power supply voltage VDD by PVT variations is used as a bias input of the comparator 434 among the components of the second reference voltage generator 430, it remarkably decreases the probability that an offset voltage occurs at the input end of the comparator 434 unless the voltage level of the power supply voltage VDD from the outside sharply increases. Actually, because there is little possibility that the voltage level of the power supply voltage VDD from the outside sharply increases, it is considered that the voltage level of the second reference voltage VREF2 will be always stably maintained regardless of an increase in the voltage level of the power supply voltage VDD from the outside.

Figure 7:
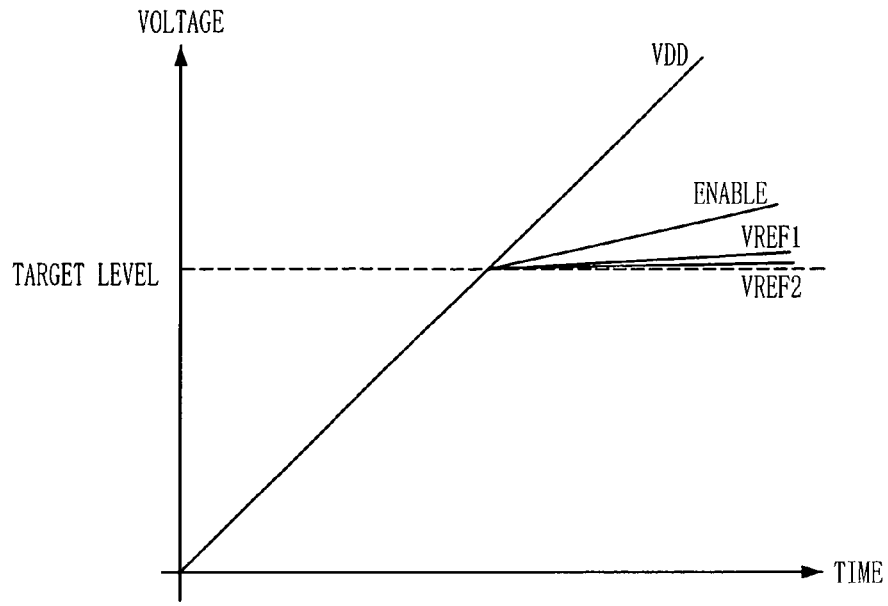
FIG. 7 is a graph showing voltage level variations of a bias voltage and first and the second reference voltages generated by the bias voltage generator and the first and the second reference voltage generators in FIG. 5 according to voltage level variations of a power supply voltage from the outside.

FIG. 7 is a graph showing voltage level variations of the bias voltage and the first and the second reference voltages generated by the bias voltage generator and the first and the second reference voltage generators in FIG. 5 according to voltage level variations of the power supply voltage from the outside.

Referring to FIG. 7, it can be seen that although the voltage level of the bias voltage ENABLE generated by the bias voltage generator 400 increases according to an increased level of the power supply voltage VDD from the outside, an increased voltage level variation width of the bias voltage ENABLE is relatively smaller than that of the power supply voltage VDD.

Likewise, it can be confirmed that although the voltage level of the first reference voltage VREF1 increases according to an increased voltage level of the bias voltage ENABLE, an increased voltage level variation width of the first reference voltage VREF1 is relatively smaller than that of the bias voltage ENABLE.

Further, it can be found that although the voltage level of the second reference voltage VREF2 increases according to an increased level of the first reference voltage VREF1, an increased voltage level variation width of the second reference voltage VREF2 is relatively smaller than that of the first reference voltage VREF1.

Lastly, it can be seen that when comparing the increased voltage level variation width of the power supply voltage VDD from the outside with that of the second reference voltage VREF2, the voltage level of the second reference voltage VREF2 does not almost increase.

Figure 8:
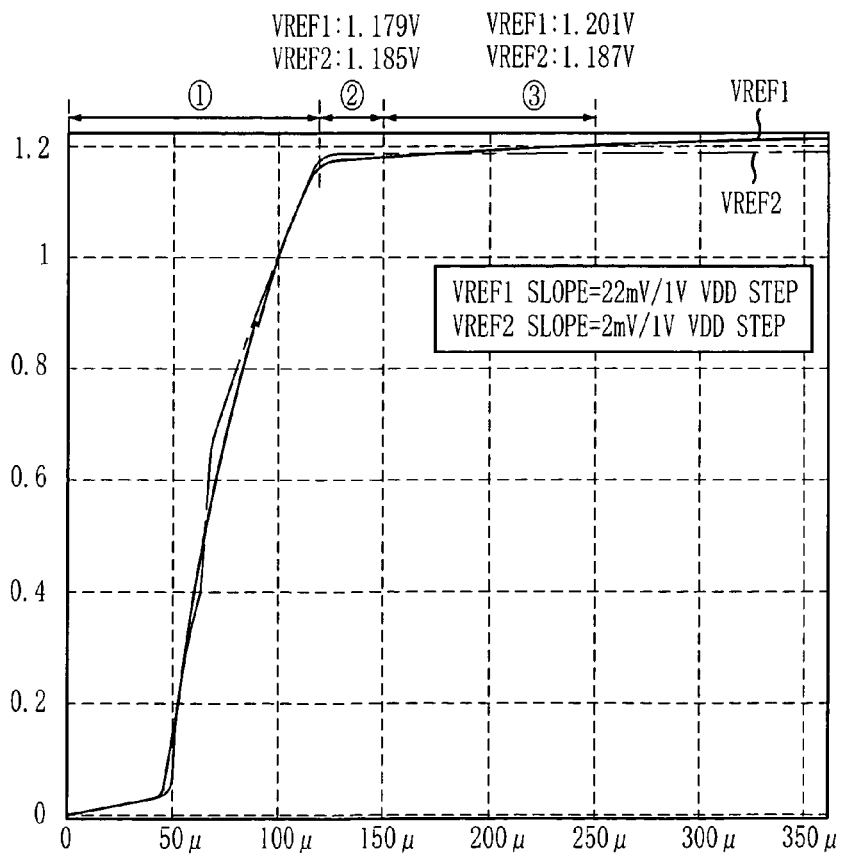
FIG. 8 is a simulation result representing voltage level variations of first and second reference voltages outputted from the first and the second reference voltage generators shown in FIG. 5 according to voltage level variations of a power supply voltage from the outside.

FIG. 8 is a simulation result representing voltage level variations of the first and the second reference voltages outputted from the first and the second reference voltage generators shown in FIG. 5 according to voltage level variations of the power supply voltage from the outside.

That is, FIG. 8 shows voltage level variation differences between the first and the second reference voltages VREF1 and VREF2 according to level variations of the power supply voltage from the outside, when actually applying the first and the second reference voltage generators 420 and 430 shown in FIG. 5 to the semiconductor device.

More specifically, in an initialization section ①, the power supply voltage VDD is supplied to the semiconductor device, and thus the first and the second reference voltages VREF1 and VREF2 reach a target voltage level.

At a first time point ② after the initialization section ①, the voltage level of the first reference voltage VREF1 is 1.179 V and the voltage level of the second reference voltage VREF2 is 1.185 V. At this time, there is a level difference of 0.006 V between the first reference voltage VREF1 and the second reference voltage VREF2, but this may be ignored because it is relatively very small in comparison with the target voltage level thereof.

At a second time point ③ where the voltage level of the power supply voltage VDD increases by about 1 V after the first time point ②, the voltage level of the first reference voltage VREF1 is 1.201 V and the voltage level of the second reference voltage VREF2 is 1.187 V. Thus, it can be seen that the voltage level of the first reference voltage VREF1 increased by 0.022 V but the voltage level of the second reference voltage VREF2 increased by 0.002 V at the second time point ③ as compared to the first time point ②. That is, it can be found that the increased voltage level variation width of the first reference voltage VREF1 is elevenfold as large as that of the second reference voltage VREF2.

As described above, the present invention can generate a stable reference voltage VREF2 maintaining a preset target voltage level even when a voltage level of a power supply voltage VDD from outside relatively sharply increases by PVT variations, thereby preventing a malfunctioning of a semiconductor device that may occur due to voltage level variation of a reference voltage.

As a result, the present invention configures a circuit for generating a reference voltage in several steps when a level of a power supply voltage from outside relatively sharply increases, and thus can generate a stable reference voltage maintaining a preset target voltage level.

It should be noted that the logic gates and transistors used in the above embodiment may be implemented at different locations and in different types based on the polarities of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a bias voltage generator for generating a bias voltage;
a first reference voltage generator for generating a first reference voltage in response to the bias voltage;
a first band gap circuit for dividing a voltage at a second reference voltage output node to produce first and second band gap voltages having a property relative to temperature variations;
a first comparator for receiving the first reference voltage and comparing the first band gap voltage with the second band gap voltage; and
a first driver for pull-up driving the second reference voltage output node in response to an output signal of the first comparator,
wherein the first reference voltage generator includes:
a second band gap circuit for dividing a voltage at a first reference voltage output node to produce a third band gap voltage having a negative property and a fourth band gap voltage having a positive property relative to the temperature variations;
a second comparator for receiving the bias voltage as a bias input and comparing the third band gap voltage with the fourth band gap voltage: and
a second driver for pull-up driving the first reference voltage output node in response to an output signal of the second comparator, wherein the second driver is provided with a PMOS transistor for controlling a connection of a power supply voltage terminal and the first reference voltage output node coupled to its source and drain, respectively, in response to the output signal of the second comparator applied via its gate.

2. The semiconductor device of claim 1, further comprising:
a plurality of internal reference voltage generators for generating a plurality of internal reference voltages having preset different voltage levels in response to a second reference voltage; and
a plurality of internal voltage generators for producing a plurality of internal voltages based on the plurality of internal reference voltages.

3. The semiconductor device of claim 1, wherein the first band gap voltage has a negative property and the second band gap voltage has a positive property relative to the temperature variations.

4. The semiconductor device of claim 3, wherein the first band gap circuit includes:
a first band gap voltage generator for dividing the voltage at the second reference voltage output node to produce the first band gap voltage having a negative property relative to the temperature variations; and
a second band gap voltage generator for dividing the voltage at the second reference voltage output node to generate the second band gap voltage having a positive property relative to the temperature variations.

5. The semiconductor device of claim 4, wherein the first band gap voltage generator includes:

a first resistor having a fixed resistance value relative to the temperature variations; and a first bipolar junction transistor whose resistance value has a negative property relative to the temperature variations, wherein the first resistor and the first bipolar junction transistor are coupled in series between the second reference voltage output node and a ground voltage terminal and the first band gap voltage is outputted at a connection node of the first resistor and the first bipolar junction transistor.

6. The semiconductor device of claim 5, wherein the second band gap voltage generator includes:

a second resistor having a fixed resistance value relative to the temperature variations;

a third resistor having a fixed resistance relative to the temperature variations; and a second bipolar junction transistor whose resistance value has a negative property relative to the temperature variations, and having an emitter size which is X times as large as the first bipolar junction transistor, wherein the second resistor, the third resistor, and the second bipolar junction transistor are coupled in series between the second reference voltage output node and the ground voltage terminal and the second band gap voltage is outputted at a connection node of the second resistor and the third resistor.

7. The semiconductor device of claim 1, wherein the first comparator includes:

a first NMOS transistor for controlling a connection of a driving node and a common node coupled to its drain and source, respectively, in response to the first band gap voltage applied via its gate;

a second NMOS transistor for controlling a connection of an output node and the common node coupled to its drain and source, respectively, in response to the second band gap voltage applied via its gate;

first and second PMOS transistors, connected in a current mirror type between a power supply voltage terminal, the driving node and the output node, for controlling an amount of current flowing into the driving node to be equal to that flowing into the output node; and a third NMOS transistor for controlling a connection of the common node and a ground voltage terminal coupled to its drain and source, respectively, in response to the first reference voltage applied via its gate.

8. The semiconductor device of claim 1, wherein the first driver is provided with a PMOS transistor for controlling a connection of a power supply voltage terminal and the second reference voltage output node coupled to its source and drain, respectively, in response to the output signal of the first comparator applied via its gate.

9. The semiconductor device of claim 1, wherein the bias voltage generator is provided with a PMOS transistor and an NMOS transistor coupled in series between a power supply voltage terminal and a ground voltage terminal and generates the bias voltage at a connection node of the PMOS transistor and the NMOS transistor, the PMOS transistor controlling a connection of the power supply voltage terminal and the connection node of the PMOS transistor and the NMOS transistor coupled to its source and drain, respectively, in response to a ground voltage applied via its gate, and the NMOS transistor operating as a diode between the ground voltage terminal connected to its source and the connection node of the PMOS transistor and the NMOS transistor connected to its gate and drain.

10. The semiconductor device of claim 1, wherein the second band gap circuit includes:

a first band gap voltage generator for dividing the voltage at the first reference voltage output node to produce the third band gap voltage having a negative property relative to the temperature variations; and a second band gap voltage generator for dividing the voltage at the first reference voltage output node to produce the fourth band gap voltage having a positive property relative to the temperature variations.

11. The semiconductor device of claim 10, wherein the first band gap voltage generator includes:

a first resistor having a fixed resistance value relative to the temperature variations; and a first bipolar junction transistor whose resistance value has a negative property relative to the temperature variations, wherein the first resistor and the first bipolar junction transistor are coupled in series between the first reference voltage output node and a ground voltage terminal and the third band gap voltage is outputted at a connection node of the first resistor and the first bipolar junction transistor.

12. The semiconductor device of claim 11, wherein the second band gap voltage generator includes:

a second resistor having a fixed resistance value relative to the temperature variations;

a third resistor having a fixed resistance value relative to the temperature variations; and a second bipolar junction transistor whose resistance value has a negative property relative to the temperature variations, and having an emitter size which is X times as large as the first bipolar junction transistor, wherein the second resistor, the third resistor, and the second bipolar junction transistor are coupled in series between the first reference voltage output node and the ground voltage terminal and the fourth band gap voltage is outputted at a connection node of the second resistor and the third resistor.

13. The semiconductor device of claim 1, wherein the second comparator includes:

a first NMOS transistor for controlling a connection of a driving node and a common node coupled to its drain and source, respectively, in response to the third band gap voltage applied via its gate;

a second NMOS transistor for controlling a connection of an output node and the common node coupled to its drain and source, respectively, in response to the fourth band gap voltage applied via its gate;

first and second PMOS transistors, connected in a current mirror type between a power supply voltage terminal, the driving node and the output node, for controlling an amount of current flowing into the driving node to be equal to that flowing into the output node; and a third NMOS transistor for controlling a connection of the common node and a ground voltage terminal coupled to its drain and source, respectively, in response to the bias voltage applied via its gate.

14. The semiconductor device of claim 1, wherein the first reference voltage generator employs a Widlar circuit.

* * * * *